United States Patent [19]

Lawrence et al.

[11] Patent Number: 4,803,333
[45] Date of Patent: Feb. 7, 1989

[54] VIEWING OPTICS FOR EXTERNAL-MOUNT ELECTRON BEAM WELDERS

[75] Inventors: Glen S. Lawrence, Naperville; Timothy J. Haynie, Hickory Hills; Joseph D. Ferrario, LaGrange; Stefan P. Kyselica, Willow Springs, all of Ill.

[73] Assignee: Ferranti Sciaky, Inc., Chicago, Ill.

[21] Appl. No.: 178,363

[22] Filed: Apr. 6, 1988

[51] Int. Cl.$^4$ ............................................. B23K 15/00
[52] U.S. Cl. ........................... 219/121.13; 219/121.23
[58] Field of Search ...................... 219/121.13, 121.12, 219/121.14, 121.18, 121.19, 121.2, 121.23; 350/486, 286

[56] References Cited

U.S. PATENT DOCUMENTS

| | | | |
|---|---|---|---|
| 3,300,618 | 1/1967 | Sciaky | 219/121 EP |
| 3,383,492 | 5/1968 | Solomon | 219/121 EP X |
| 4,663,511 | 5/1987 | Tallman | 219/121 EL X |

Primary Examiner—C. L. Albritton
Attorney, Agent, or Firm—Julius L. Solomon

[57] ABSTRACT

An optical system for use in an electron beam welding machine for viewing workpieces mounted within a vacuum chamber from a position outside the chamber, either before or during the welding operation. The optical system includes an automatic motorized means for adjusting the focus of the system to accommodate different electron beam gun to work distances, and simultaneously to automatically adjust the angle with respect to the axis of the electron beam along which the view of the area being welded is to be observed. A transparent disc, which may be rotated step by step about its central axis in approximately 30° increments is mounted so that a portion of its surface near its periphery is interposed in the viewing path so as to shield the optical parts of the viewing system from the vapors and radiations which are generated during the electron beam welding process. A means for illuminating only the area on the work surface which is to be viewed is also provided with a similar shielding means.

7 Claims, 4 Drawing Sheets

VIEWING OPTICS FOR EXTERNAL-MOUNT ELECTRON BEAM WELDERS

This invention relates to the art of electron beam welding within a vacuum chamber and has specific reference in particular to an optical system for viewing the workpieces to be welded from outside the vacuum chamber, either before or during the welding operation.

The electron beam welding process is usually carried out in a sealed chamber under a high vacuum (perhaps $10^{-5}$ Torr). The workpieces are generally supported within the chamber on a carriage adapted to have movement in the direction of the seam to be welded. The electron gun utilized for generating a beam of electrons may be either the relatively low-voltage type; that is, one that accelerates electrons to a maximum of 60,000 electron volts; or one of the high-voltage type, in which the electrons are accelerated to 150,000 electron volts or more. If the electron gun is of the low-voltage type, it will be relatively small in size and is adapted to be mounted within the vacuum chamber on a carriage which moves the gun along one axis, with the work mounted on a second carriage which is arranged to move the work parallel to an axis which is perpendicular to the axis along which the gun travels. An optical system suited for use on a low-voltage electron beam welding machine is described in U.S. Pat. No. 3,383,492.

For machines utilizing high-voltage guns, because of the size of the guns and their weight, the guns are usually fixed to an outer wall of the vacuum chamber, with the work mounted on the opposite walls inside the chamber on a compound carriage which allows motion along two mutually perpendicular axes. In order to properly align the electron beam generated by the electron gun so that it impinges upon the seam to be welded, and in order to observe the welding as it is carried on, it is necessary to provide a viewing system through which the working area may be observed with a view from a point directly above the point of impingement of the electron beam and preferably along a line which passes through the work area and is displaced only a few degrees from the axis of the electron beam.

Inasmuch as the distance from the work to the electron gun may vary from workpiece to workpiece, it is also necessary to provide means in the optical system to allow for focusing the optics in order to provide a clear view of the point of impingement of the electron beam on the work surface along the seam. It is also necessary to provide means for transferring the image of the object being viewed within the chamber to a telescope or binocular outside the chamber.

In view of the foregoing, it is an object of the invention to provide an optical system for electron beam welding machines which will enable the operator to conveniently view the workpieces from a position outside the vacuum chamber before, during and after welding.

Another object is to provide a means for viewing a spot on a workpiece along a line which intersects the electron beam at the workpiece surface.

Another object is to provide means for transferring the image of the object being viewed from within the chamber to a convenient place outside the vacuum chamber.

Another object is to provide means for shielding the optical parts of the viewing system from the vapors and radiations which are generated during the electron beam welding process.

Another object is to provide a means for illuminating only the area on the work surface which is to be viewed.

Another object is to provide an automatic motorized means for adjusting the focus of the viewing system to accommodate different electron beam gun to work distances, and at the same time to adjust the angle with respect to the axis of the electron beam along which the view of the area being welded is to be observed.

With these and various objects in view, the invention may consist of certain novel features of construction and operation, as will be more fully described and more particularly pointed out in the specification, drawings and claims appended thereto.

In the drawings which illustrate the embodiment of the device, and wherein like reference characters are used to designate like parts:

Figure 1:
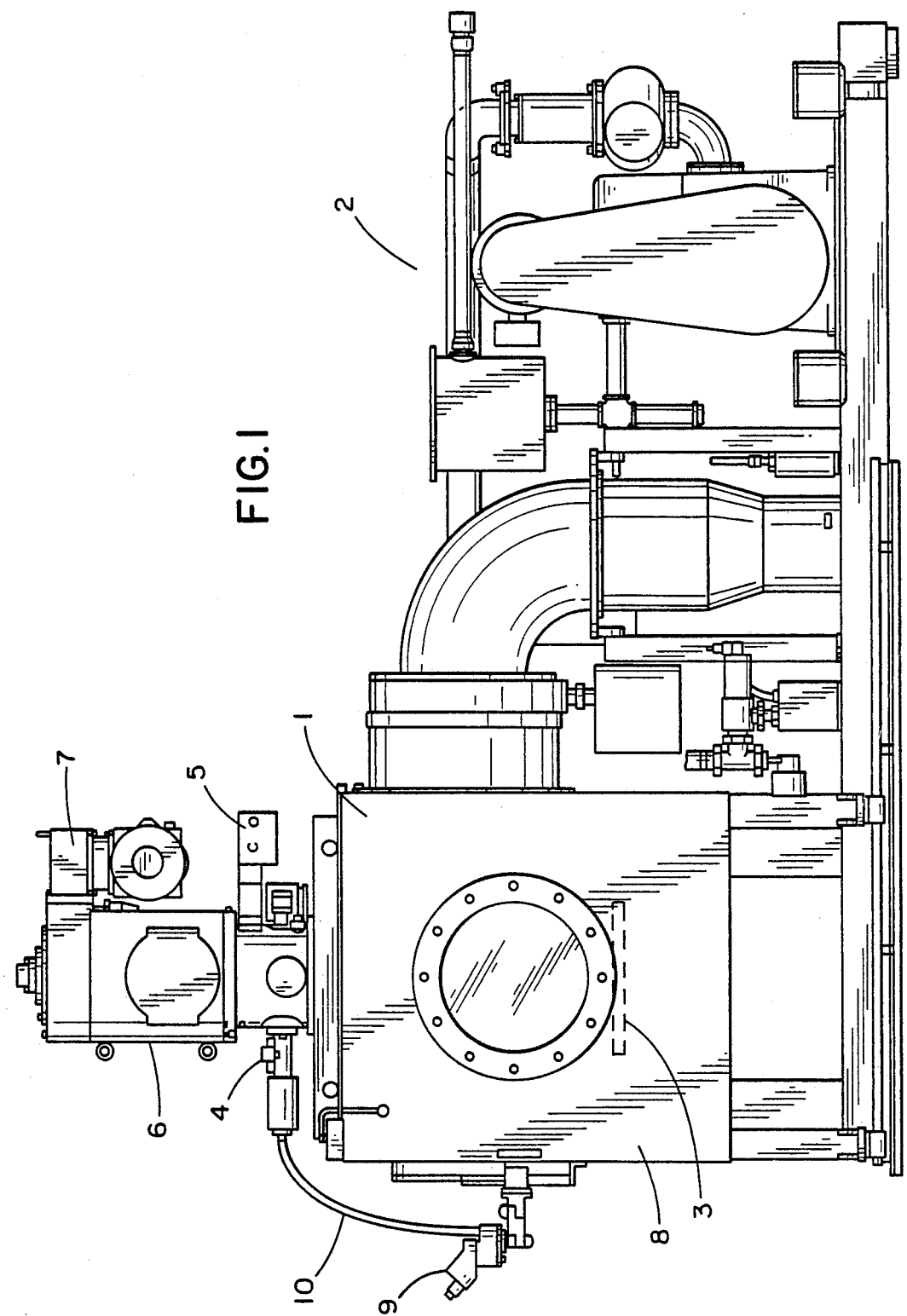
FIG. 1 is a sectional view of an electron beam welding machine of the high-voltage type, showing the placement of the electron gun, gun valve, optical system and vacuum chamber, and the work-holding carriage.

A sectional view of an electron beam welding machine of the high-voltage type is illustrated in FIG. 1. The machine comprises a vacuum chamber [1] with suitable vacuum equipment [2] to bring the pressure in the chamber to $10^{-5}$ Torr and a carriage [3] for holding and moving the work to be welded. Mounted at the top of the vacuum chamber is an optical system [4] above which is a valve [5] for sealing off the electron beam gun [6], mounted above the valve, from the rest of the system. The electron gun has associated with it a vacuum pump [7] for maintaining the pressure at a low level in the electron gun when the valve is closed and the chamber open. With the gun valve closed access is provided to the interior of the vacuum chamber when the sliding door [8] is open so that the work may be mounted or removed from the carriage [3].

Figure 2:
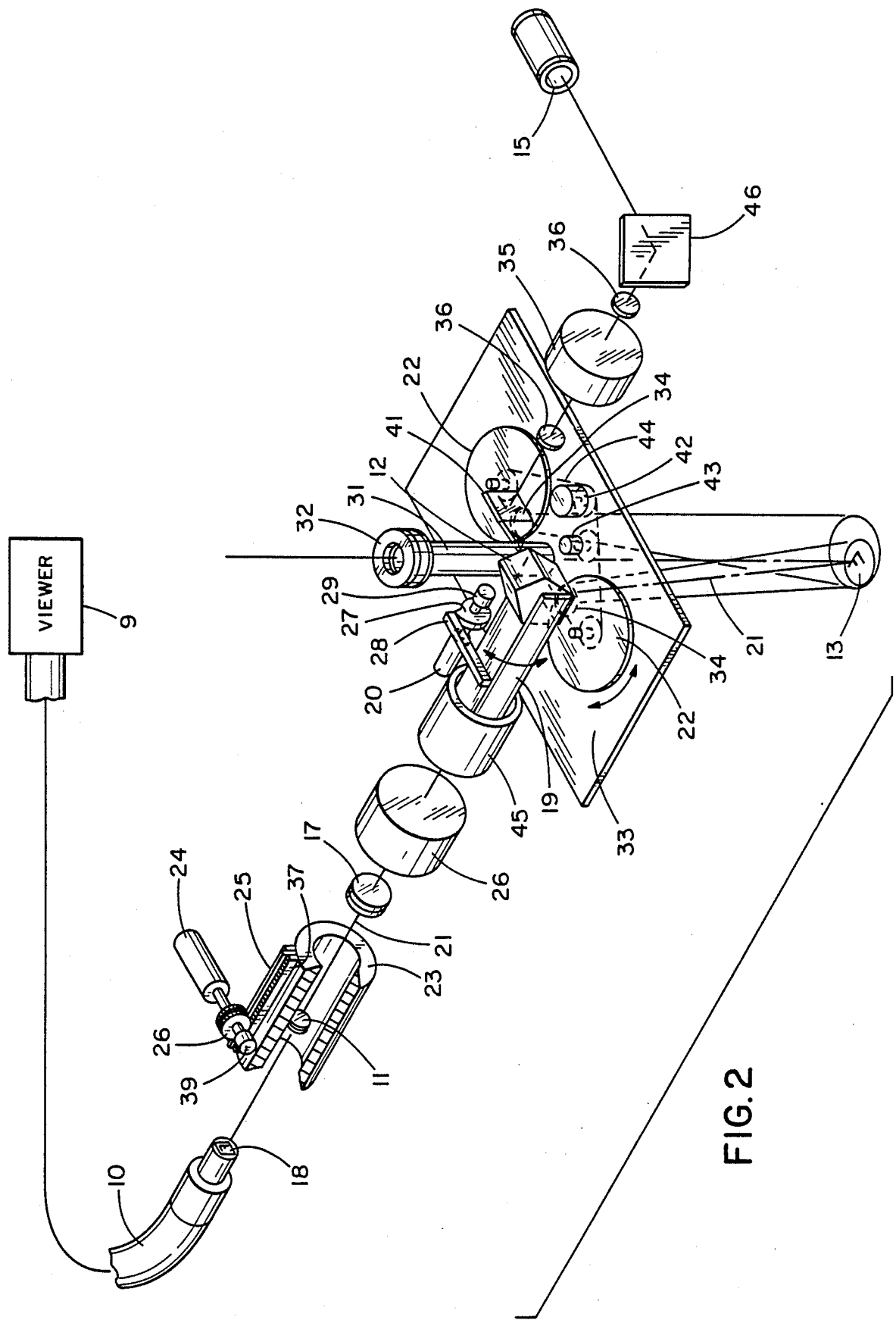
FIG. 2 is a schematic drawing of the essential parts of the optical system.

The optical system illustrated in FIG. 2 is available for viewing the work either when the chamber is open or closed or during the welding of the part. FIG. 2 is a schematic representation of the elements of the optical system. The optical system comprises: a viewer [9] which may either be binocular or monocular; a length of optical fiber [10], means for focusing the image of the object to be viewed [11]; a pentaprism [12] for carrying the image of the object [13] to the viewing system; a shutter system for shielding and protecting the optical parts from becoming coated with the vapors generated during the welding process; and a means for illuminating the work area [15].

The electron beam [16] is projected from the electron gun through an orifice in the electron gun into the evacuated chamber to the work surface. The pentaprism [12] bends the optic axis [21] 90 degrees and projects the image through an objective lens [17] and through a focusing lens [11] to the end surface [18] of a bundle of coherent optical fibers [10] and then through the fiber optics bundle. The image at the opposite end of the optical fiber bundle is viewed by the binocular or monocular viewer. The image of the object is viewed by the pentaprism at an angle of six degrees or less from the path taken by the electron beam from the gun to the work. In order to provide for viewing at different gun to work distances, the pentaprism support [19] is motorized and is by this means rotated about the telescope optical axis [21]. The focusing lenses [11] are also motorized and the position of the focusing lens is coupled electronically to the angular position of the pentaprism [12]. In this way the object may be viewed and focused and the pentaprism automatically rotated to provide a proper view of the desired object area. A shutter assembly is provided for shielding the illuminator parts and the optical parts from the vapors generated during the welding process. The shutter is provided with two glass discs [22] which can be stepped to a multiplicity of positions about the surface of the glass disc. Positions are each introduced into the vapor path in turn, by rotating the glass discs about the central axis of the discs.

Figure 3:
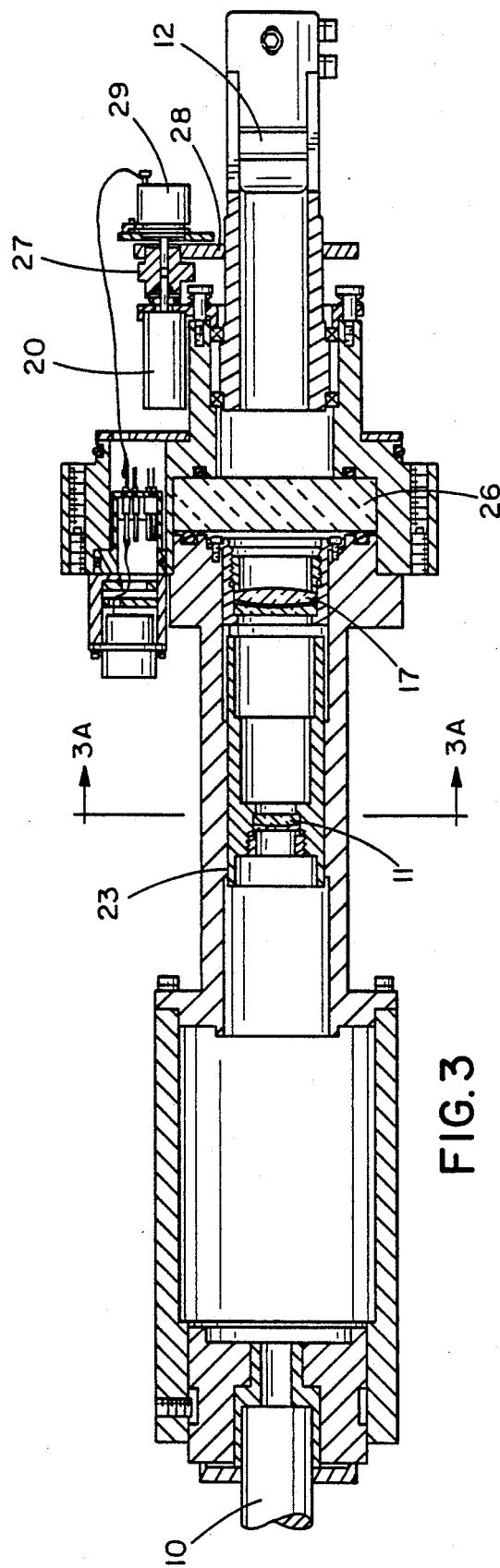
FIGS. 3, 3A and 3B are detailed views of the optical system.
Figure 3B:
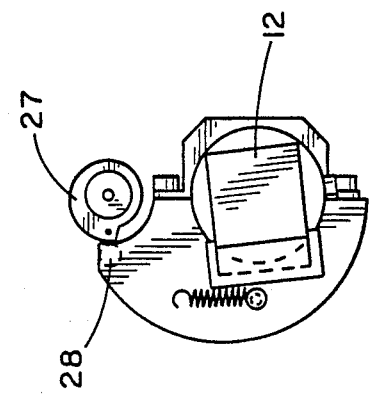
Figure 3A:
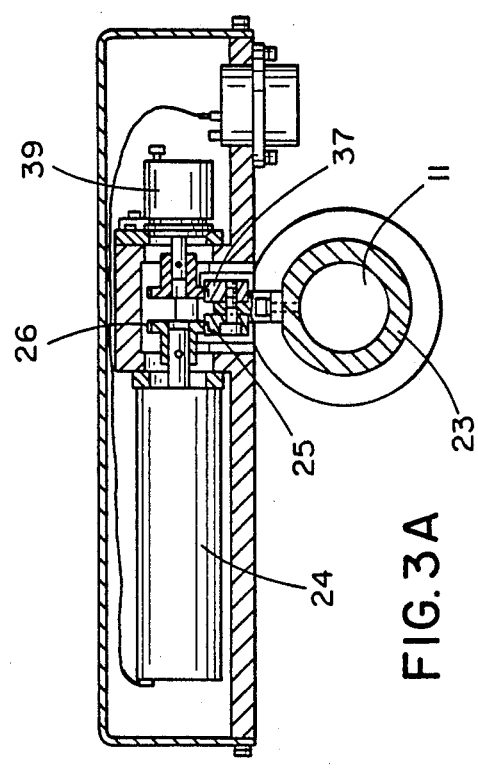

The optical system is illustrated in detail in FIG. 3. The telescope comprises an objective lens set [11] consisting of a positive flint lens and a closely spaced negative crown lens to make up the objective doublet. A cemented doublet [17] is used to focus the telescope and is mounted in a movable lens mount [23] which is positioned by an electric motor [24] via a rack [25] and pinion [26], as seen in Section AA. Also seen in Section AA is a unique means of sensing the position of the focus lens. A second identical rack and pinion set [37] is used to drive a precision potentiometer [39] so that the motor and potentiometer may be independently aligned to their respective racks. It is recognized other forms of position transducers resolvers or encoders may be used in place of the potentiometer. To focus the system the operator has simply to change a control signal (from operator's control potentiometer or from a computer output or other suitable means) and the motor will drive the focus lens until the position sensing potentiometer nulls out the operator's control signal. The operator's control signal also has a second use which is explained later. The purpose in moving the focus lens doublet is to image the workpiece inside the vacuum chamber onto the end of the fiber optic bundle [10] shown at the left hand of the telescope. It is recognized that the light sensing element of a television camera can replace the fiber optic bundle to achieve TV viewing of the work. Shown to the right of the objective lens is an optical quality lead glass window [26]. The window is seated on an "O"-ring seal and forms the boundary between the atmospheric section of the optics (to the left) and the vacuum section of the optics (to the right). In addition to being a vacuum barrier the lead glass window is also the x-radiation barrier in the optical path. The remaining optic element on the telescope is the pentaprism which rotates the optic path through 90 degrees and permits viewing down alongside the electron beam. The pentaprism is mounted in a cylinder [19], the pentaprism holder, which allows it to rotate within bearing [45] around the telescope optic axis. The effect of rotation of the pentaprism is to swing the folded optic path (the view down the beam) from parallel to the electron beam to an intersecting angle to the electron beam. The total required angular motion is about six degrees for the prism. The rotation is controlled by a motor driven spiral cam [27] as shown in FIG. 2. The cam follower [28] attached to the pentaprism holder [19] is spring-loaded against the cam, thus adjusting the position of the prism as the cam is rotated. The spiral cam is rigidly attached to a precision potentiometer [29] and the electric motor [20] is connected via a flexible coupling. Since the spiral is uniform on the cam the relationship between the angle of rotation for the potentiometer and the prism is linear and is approximately 50 to 1. The position of the focusing doublet [11] corresponds to a specific angular position of the pentaprism [12] for the optic axis [21] to intersect the electron beam axis at the workpiece surface being observed.

Figure 5:
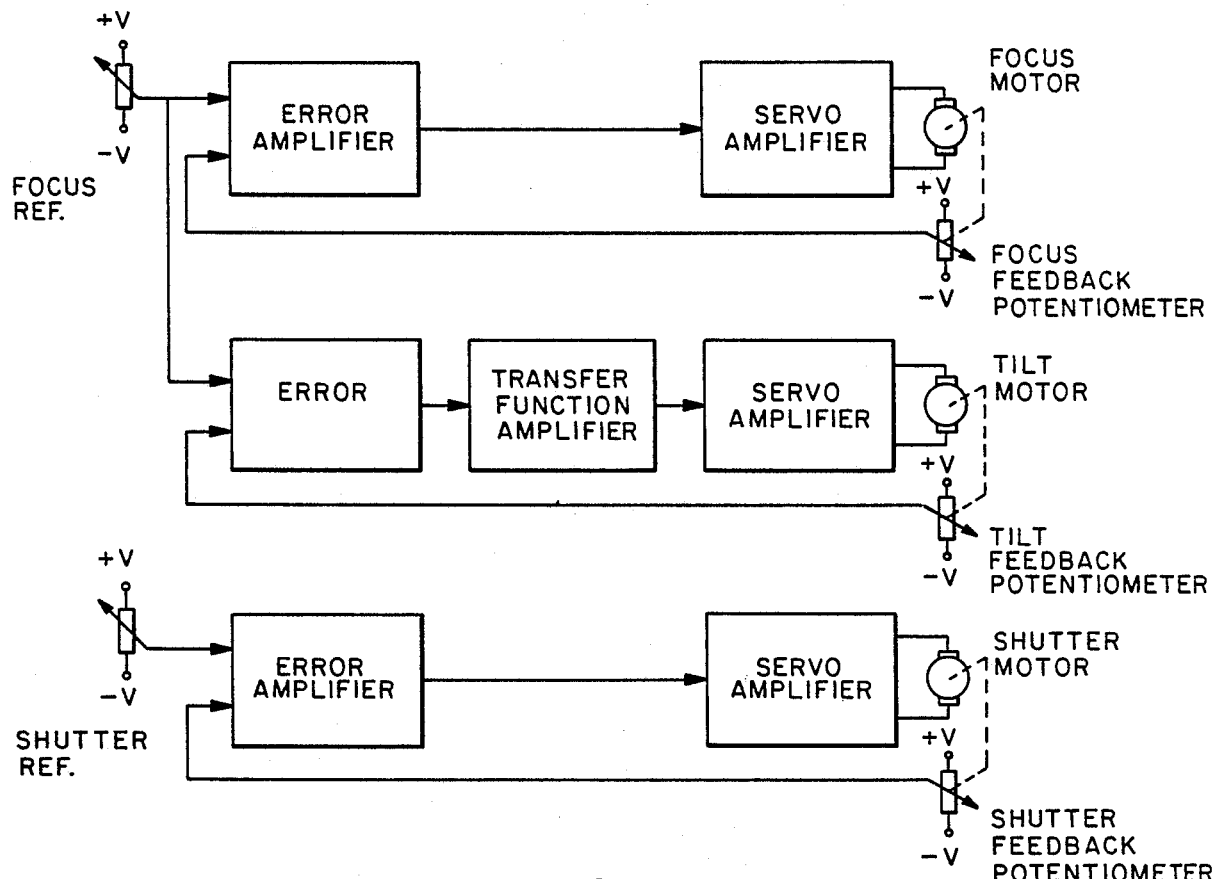
FIG. 5 is a block diagram of the control system for simultaneously adjusting the focusing lens and the weld area viewing angle with respect to the electron beam path.

FIG. 5 is a block diagram of the control system by which the telescope is focused to view the work area and the angular position of the pentaprism adjusted to the proper angle for viewing the desired work area.

Figure 4:
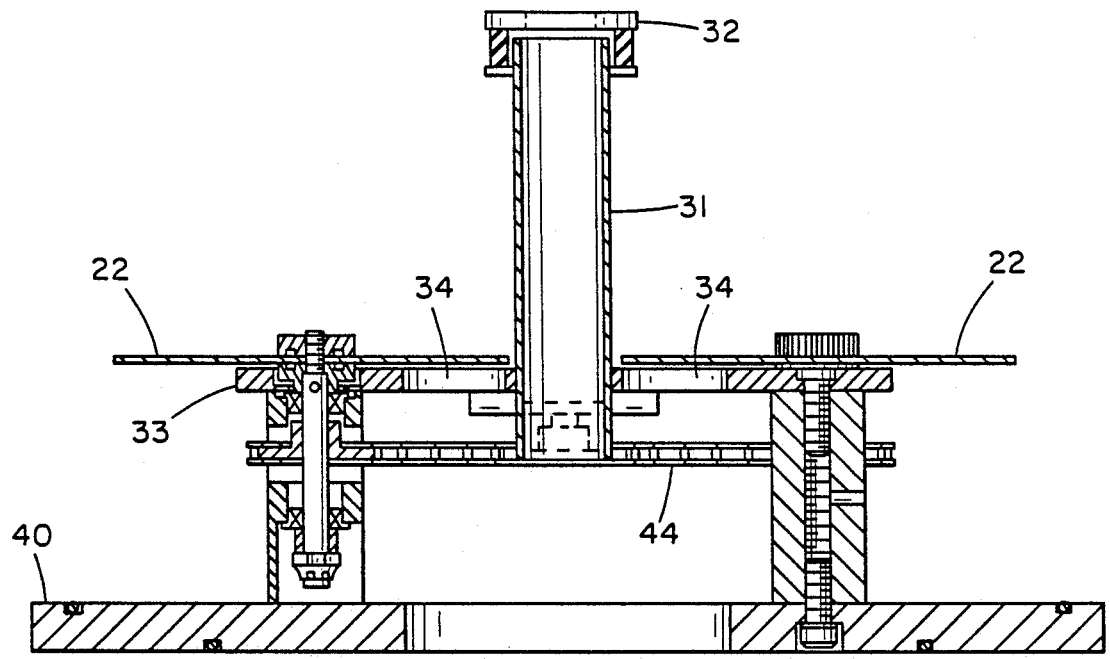
FIG. 4 is a detailed view of the shutter mechanism utilized in the optical system.

The positioning of the focusing doublet as seen above is determined by the operator's control signal. This signal is also processed by a circuit which has stored within it the correspondence between focus doublet position and required angle for the pentaprism. This special circuit may be called an electronic cam and the output corresponds to the required angle for the pentaprism or the required output from the spiral cam potentiometer. A standard null circuit is used to drive the cam to the required position so that the potentiometer signal nulls the electronic cam signal. The fiber optic bundle at the left hand of the telescope on FIG. 3 is a coherent bundle which is placed outside the radiation environment. The length of the fiber optic is determined by the size of the work chamber on which the electron beam gun is used and the distance to the operator's console. Typical lengths may be from three to six feet for the average electron beam welders. The image projected to the end of the fiber optic bundle is viewed with a binocular or monocular telescope. The binocular head assembly shown in FIG. 1 utilizes a standard binocular viewer and is adapted for viewing the end of the fiber bundle by adding an objective lens doublet and a field flattening lens. The objective lens can be adjusted to accommodate eye differences from one operator to another. The optical path inside the binocular head is folded 180 degrees by means of two prisms on the optics mounting plates subassembly. This fold in the optics path allows the fiber bundle to enter the binocular head without unnecessary bends and thus maintains maximum flexibility for positioning the optics for operator convenience and comfort. A two-part prism holder permits the prisms to be tilted or rotated to achieve good optic alignment. A light attenuation means assembly is also fitted to the binocular head assembly. This allows for an attenuated or an unattenuated view of the work. The shutter assembly is shown in detail in FIG. 4. This assembly is mounted at the separation of the viewing optic path from the electron beam path and provides the vapor protection for the viewing optics preventing the deposition on the optical parts of various condensed vapors, which result from the welding process. Since the electron beam must have a clear aperture it passes through the central tube [31]. This beam tube is sufficiently long that the bottom is well below the viewing optics and the top is well above so that vapors passing up the tube will not contaminate the optics. It also shields the electron beam from stray electrostatic charges. The beam tube [31] is fabricated of metal and also serves as an electrostatic shield to prevent stray charges from building up on the glass optics and deflecting the electron beam. Such stray charges would cause beam jitter or a lack of pointing accuracy for the beam. The beam tube fabricated of a good magnetic shielding material such as mumetal also shields the beam from the magnetic fields of the electric motors and whatever magnetic fields exist in the equipment in close proximity to the beam path. The top of the beam tube also supports an electrically isolated beam wander ring [32]. This ring is connected to a detector circuit and will shut off the beam if the beam wanders off center and the ring starts to pick up fringe electrons from the beam.

The central beam tube is supported from the vapor shield base plate [33]. This plate is the main vapor shield for the large aperture in the registration disc [40]. The vapor shield base plate has two apertures [34] in it—one for the viewer to see through and one for the illuminator. These two apertures are shielded with replaceable shield glasses [22]. Each aperture has its own shield glass and each shield glass is in the form of a disc. As noted above the shield glasses are sufficiently large to have a multiplicity of viewing areas obtained by rotating the discs over one nth of a revolution where "n" would be the number of fresh viewing areas on the disc. One of the shield areas may also be used as a shutter to protect the clean area of the glass when the operator is not viewing. The shield glasses being motorized [42] can be moved from one position to another very rapidly. The vapor shield potentiometer [43], driven by chain L44], is part of the servo system which determines each position of the shield glasses. The glass can thus be rotated from a viewing area to the shutter area whenever the optics are not in use so as to conserve the clean areas when viewing is required.

The illuminator is mounted in the atmosphere environment and projects its illumination through a lead glass window and radiation shield [35] into the vacuum chamber. The light source [15] is provided with a means for filtering out the infrared energy [46]. A series of lenses [36] collimates the light for optimum illumination of the work, and a 90-degree prism or mirror [41] is used to fold the illumination path and project the light down the electron beam column. The illuminator is provided with a rotatable prism holder and a positionable projector lens mount which allow the light source to be adjusted to fit a specific machine or application. Access doors are provided in the housing for this equipment in order to provide easy access for changing the shield glass discs.

The invention is not to be limited to or by details of construction of that particular embodiment thereof illustrated by the drawings as various other forms of the device will of course be apparent to those skilled in the art without departing from the spirit of the invention or the scope of the claims.

What we claim is:

1. In an electron beam welding machine consisting of: a vacuum chamber; an electron beam gun mounted upon said vacuum chamber; a means for directing an electron beam along a path from said electron beam gun to the inside of said chamber; a carriage mounted within said chamber and movable along two mutually perpendicular axes; a means for mounting on said carriage, workpieces to be welded along a seam by said electron beam; and an optical system mounted on said machine for viewing, from outside the chamber, the area to be welded on said workpieces, the said optical system comprising:

a telescope including an objective and a focusing lens system, arranged along an optical axis which is perpendicular to the path of said electron beam and passes through the center of the said lens system;

a pentaprism for bending the optic axis by 90 degrees mounted along the said optic axis, between the said objective lens and the path of the said electron beam;

a means for supporting and rotating the said pentaprism in a plane perpendicular to said optic axis;

a coherent fiber optics bundle having one end centered along the optic path and adjacent to the said focusing lens;

a means for moving said focusing lens along the optic path so as to project the image of a desired area on a workpiece upon which the said electron beam can impinge;

a means cooperating with the said means for moving said focusing lens for automatically rotating the said pentaprism in said plane so that it views an area on the workpiece upon which the said electron beam impinges, and which area is projected in sharp focus onto the said first end of the fiber optics bundle;

and means for viewing the image which is transmitted to the opposite end of the fiber optics bundle.

2. An optical system as in claim 1 including means cooperating with said focusing means for rotating the pentaprism about the axis of the said focusing system optics so as to maintain the view of a desired area over a range of electron beam gun to work distances.

3. An optical system as in claim 1 including means for illuminating only the area to be viewed.

4. An optical system as in claim 1 including shield means for preventing metallic or nonmetallic vapors generated during the welding process from being deposited on parts of the optical system.

5. An optical system as in claim 4 in which the said shield comprises two rotatable transparent discs—one of said discs positioned in the illumination path, and the other of said discs positioned in the viewing path of the said optical system including means for positioning said discs to a series of separate areas on the said discs.

6. An optical system as in claim 4 including means for stepping the said shield discs from one position to the next with each successive viewing of the area being welded.

7. An optical system as in claim 6 including means for stepping the said optical shield discs to a given position when the weld area is not to be viewed.

* * * * *